United States Patent [19]
Roscoe

[11] Patent Number: 5,973,934
[45] Date of Patent: Oct. 26, 1999

[54] PRINTED CIRCUIT BOARD LATCHING MECHANISM

[75] Inventor: Brett Roscoe, Houston, Tex.

[73] Assignee: Compaq Computer Corporation, Houston, Tex.

[21] Appl. No.: 09/099,592

[22] Filed: Jun. 18, 1998

[51] Int. Cl.$^6$ .............................. H05K 7/14; B65D 85/86
[52] U.S. Cl. ......................... 361/796; 361/754; 361/759; 361/801; 211/41.17; 206/706
[58] Field of Search .................................... 361/683, 685, 361/724, 726, 752, 754, 759, 796, 801, 802; 211/41.17; 206/706; 248/560; 439/928.1

[56] References Cited

U.S. PATENT DOCUMENTS 5,673,172   9/1997  Hastings et al. ........................ 361/685
5,828,546  10/1998  Tirrell et al. ............................ 361/685

Primary Examiner—Leo P. Picard
Assistant Examiner—Jayprakash N. Gandhi
Attorney, Agent, or Firm—Williams, Morgan & Amerson

[57] ABSTRACT

An apparatus is provided for coupling a printed circuit board within a printed circuit board cage. The apparatus includes a first portion coupled to the printed circuit board cage. A second portion is rotatably coupled to the printed circuit board, and includes a cam surface formed on a first end portion thereof. The cam surface is engageable with an interior surface of a bore in the first portion to urge the second portion and the printed circuit board from a first position to a second position. The second portion also includes a latch formed on a second end portion thereof. The latch is engageable with a corresponding latch on the printed circuit board in response to the second portion being located in the second position.

26 Claims, 5 Drawing Sheets

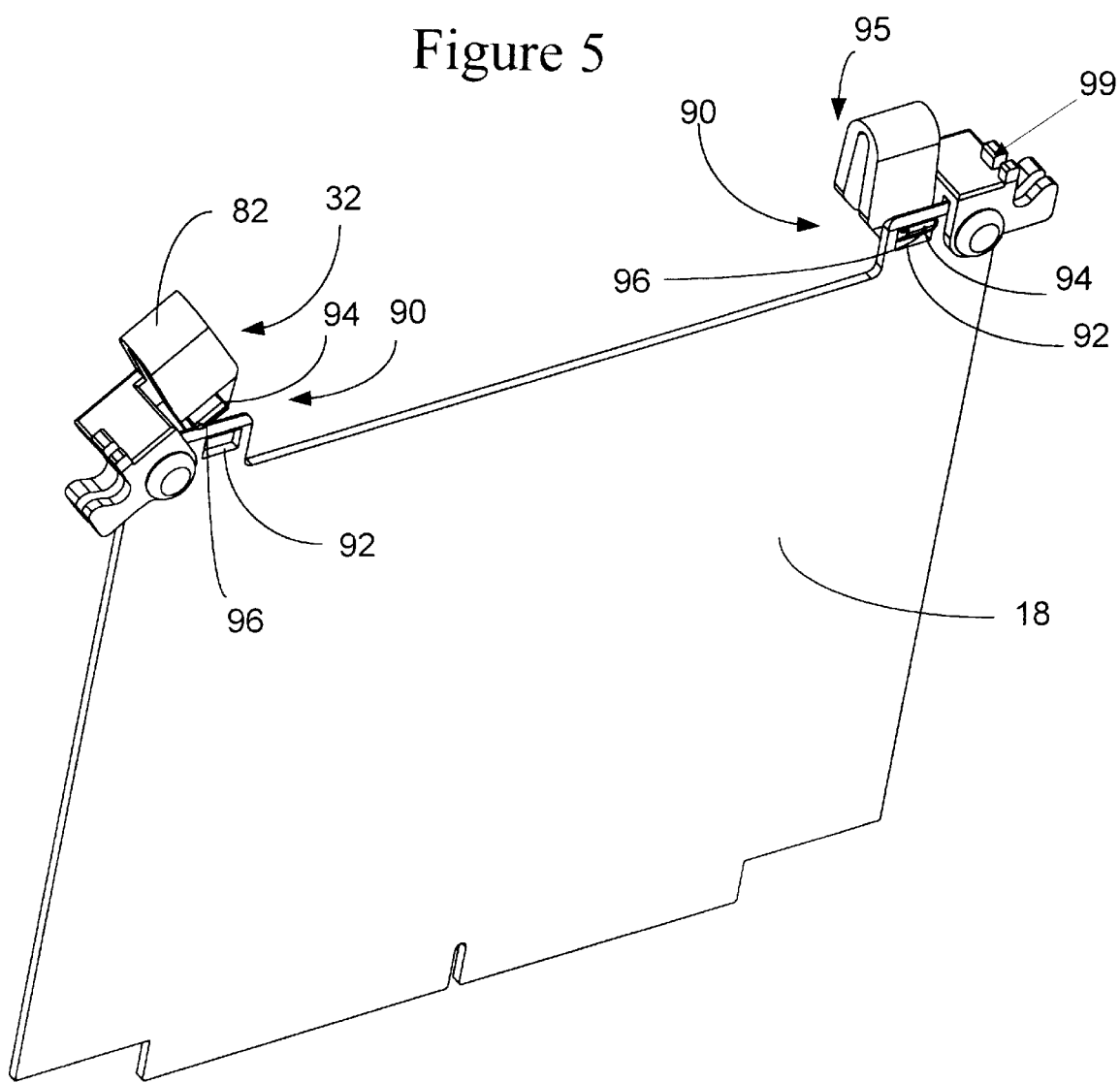

PRINTED CIRCUIT BOARD LATCHING MECHANISM

BACKGROUND OF THE INVENTION

1. Field of the Invention

This invention relates generally to a mechanism for mounting a printed circuit board, and, more particularly, to a mechanism for latching a printed circuit board into an electrical connector.

2. Description of the Related Art

In the field of electronics, designers have been continuously reducing the size of components, such as semiconductor chips, to increase the speed and performance of the electronic circuits, and to more efficiently utilize semiconductor real estate. Typically, these semiconductor chips are mounted on a printed circuit board, which is, in turn, coupled to other printed circuit boards through various electrical connectors to form an electrical system, such as a personal computer.

As the semiconductor chips have become smaller, and electrical systems have become more complex, more chips are located on a printed circuit board. As more and more semiconductor chips and electronic circuits are packed onto a printed circuit board, more and more electrical signals are generated and delivered throughout the system, especially to the other printed circuit boards. Commonly, these signals are delivered "off-board" to the other printed circuit boards via an edge connector. That is, a series of metallic tabs are formed along at least one edge of the printed circuit board, and metallic traces interconnect the semiconductor chips with the metallic tabs. The metallic tabs are arranged to coincide with spring loaded metallic tabs in an edge connector. The edge connector is interconnected with other edge connectors and printed circuit boards so that the electrical signals can be transmitted therebetween.

In systems where the edge connector area cannot be increased in proportion to the number of signals, the individual metallic tabs are necessarily reduced in width to accommodate more metallic tabs. For example, state-of-the-art microprocessor printed circuit boards have over 300 metallic tabs that measure 50 thousandths of an inch wide. The tabs are arranged in a tiered configuration with three tabs every 100 thousandths of an inch. These densely packed contacts can become misaligned with their corresponding edge connector by a relatively minor displacement of only 20 thousandths of an inch. That is, the printed circuit board can become uncoupled or disconnected from its corresponding electrical connector relatively easily. Disconnection, of course, prevents the electrical signals from being properly delivered to other printed circuit boards in the electrical system, which prevents proper operation of the system. Moreover, this relatively minor displacement is difficult to visually detect, and, thus, faulty operation is difficult to diagnose.

The large size and relatively heavy weight of current microprocessor printed circuit boards further exacerbates the alignment problem because of the board's own inertia during minor g-force shocks. That is, even a minor bumping of the electrical system may be enough to cause the printed circuit board to shift and cease proper operation.

Further, the increasing complexity of electrical systems has also resulted in more printed circuit boards being packed into the same or smaller space. Thus, less and less room is available for the electrical system, which necessitates that the boards be closely proximate one another. This close positioning of the printed circuit boards reduces the available envelope for mechanisms useful in fixing the printed circuit boards against longitudinal movement. Accordingly, bulky latching mechanisms are not useful in compact, densely packed electrical systems.

Additionally, maintaining and upgrading electrical systems commonly requires that the printed circuit boards be readily accessible, easy to remove, and easy to install. Moreover, it is a significant disadvantage if special tools are required to access, remove, or install the printed circuit boards. Rather, it is highly advantageous if a user of the electrical system can replace a printed circuit board without the use of any special tools.

The present invention is directed to overcoming, or at least reducing the effects of, one or more of the problems set forth above.

SUMMARY OF THE INVENTION

In one aspect of the present invention, an apparatus is provided for coupling a printed circuit board within a printed circuit board cage. The apparatus includes a first portion coupled to the printed circuit board cage. The first portion has a bore formed therein. A second portion is rotatably coupled to the printed circuit board, and includes a cam surface formed on a first end portion thereof. The cam surface is engageable with an interior surface of the bore of the first portion to urge the second portion and the printed circuit board from a first position to a second position. The second portion also includes a latch formed on a second end portion thereof. The latch is engageable with a corresponding latch on the printed circuit board in response to the second portion being located in the second position.

BRIEF DESCRIPTION OF THE DRAWINGS

The invention may be understood by reference to the following description taken in conjunction with the accompanying drawings, in which like reference numerals identify like elements, and in which:

FIG. 5 illustrates a perspective view of the latching mechanism of FIG. 3.

Figure 1:
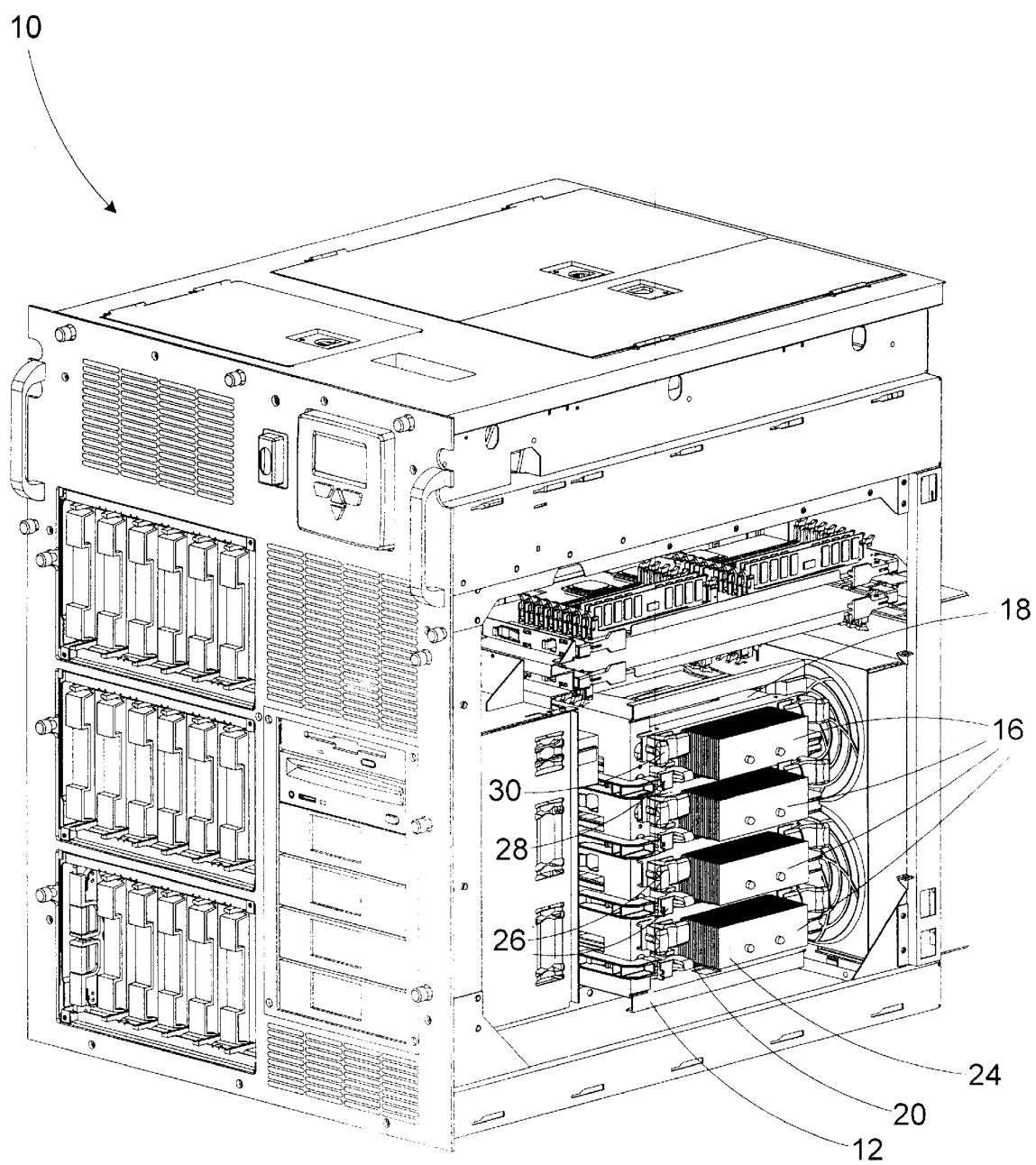
FIG. 1 illustrates a perspective of a personal computer, such as a server.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular, to FIG. 1, a perspective view of a personal computer, such as a server 10 is shown. The server 10 has a side access panel (not shown) removed, exposing a microprocessor cage 12 mounted to a motherboard (not shown). The microprocessor cage 12 houses a plurality of printed circuit boards 16. In the embodiment of the server 10 illustrated in FIG. 1, the printed circuit boards 16 are of two general types, a microprocessor printed circuit board assembly 18 and a voltage regulator module 20. As its name suggests, the microprocessor printed circuit board assembly 18 contains a microprocessor (not shown), such as an Intel Pentium II, its associated circuitry (not shown), and a heat pipe 24. The voltage regulator module 20 is positioned adjacent the microprocessor printed circuit board assembly 18, generally providing the function of controlling voltages delivered to the microprocessor board assembly 18. In the embodiment of the server 10 illustrated in FIG. 1, four microprocessor printed circuit board assemblies 18 and four voltage regulator modules 20 are included within the microprocessor cage 12. Although the illustrated embodiment includes four microprocessor printed circuit board assemblies 18 and four voltage regulator modules 20, the invention is applicable to any number of microprocessor printed circuit board assemblies 18 and voltage regulator modules 20.

The microprocessor cage 12 is mounted to the motherboard (not shown), which is vertically mounted within the server 10. Collectively, the cage 12, the microprocessor printed circuit board assemblies 18, and the voltage regulator modules 20 are relatively heavy, and, accordingly, are mounted to a support member (not shown) connected to a frame (not shown) of the server 10, rather than only to the motherboard (not shown).

Likewise, the microprocessor printed circuit board assemblies 18 and the voltage regulator modules 20 are also relatively heavy individually. Thus, latching mechanisms 26 are included for both locating the printed circuit boards 16 within their matching electrical connector (not shown), and helping to maintain the printed circuit boards 16 securely seated within their electrical connectors (not shown) during normal operation and shipping. A first type of latching mechanism 28 is associated with the voltage regulator modules 20, and a second type of latching mechanism 30 is associated with the microprocessor printed circuit board assemblies 18. The latching mechanism 28 associated with the voltage regulator modules 20 are discussed in more detail throughout this specification. The second type of latching mechanism 30 associated with the microprocessor printed circuit board assembly 18 is discussed in detail in co-pending application Ser. No. 09/009,585 filed contemporaneously with the current application, and subject to assignment to a common assignee.

Figure 2:
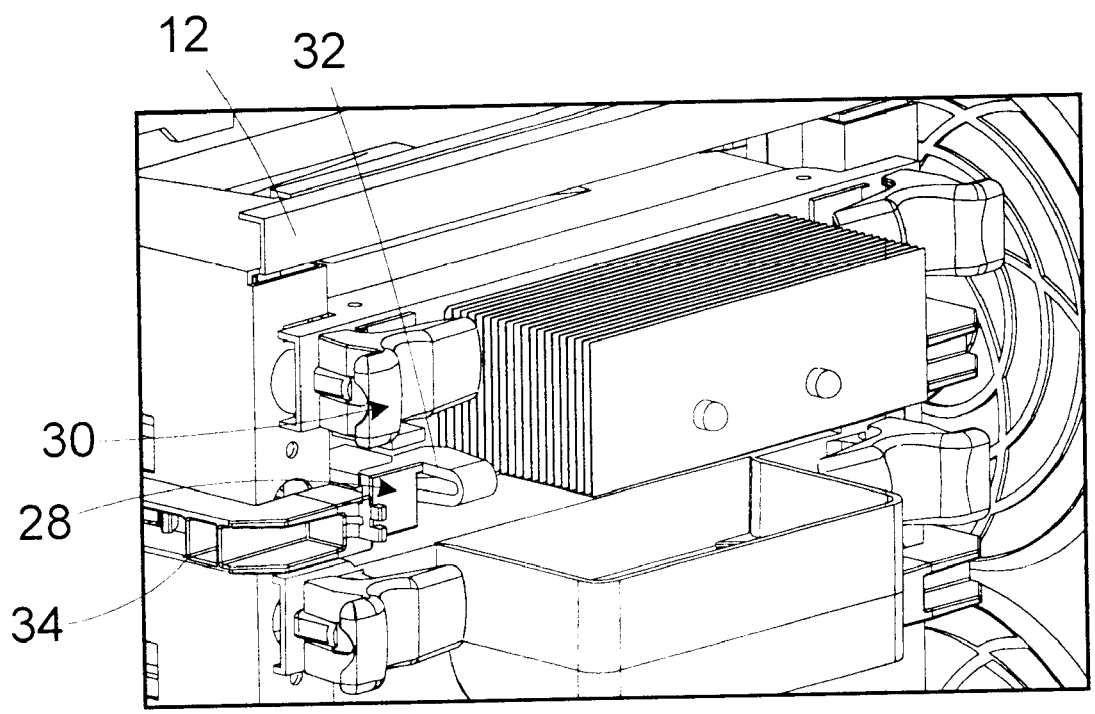
FIG. 2 illustrates a perspective view of a portion of a microprocessor cage and latching mechanism within the server of FIG. 1.

Referring now to FIG. 2, a perspective view of the microprocessor cage 12 with the latching mechanism 28 of the voltage regulator module 20 installed therein is shown. The latching mechanism 28 includes a first pivoting portion 32 rotatably attached to the voltage regulator module 20, and a second fixed portion 34 coupled to the microprocessor cage 12.

Figure 3:
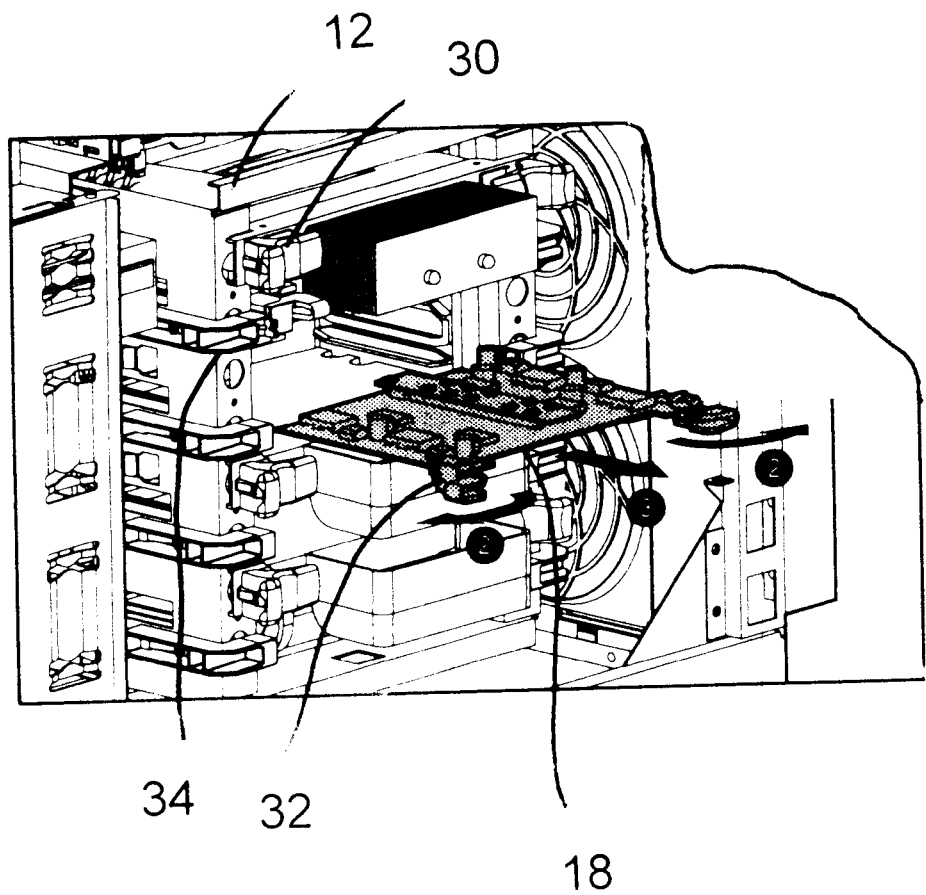
FIG. 3 illustrates an exploded perspective view of a portion of the microprocessor cage and latching mechanism within the server of FIG. 1.

Generally, the rotating portion 32 is pivotable to a first position (as shown in FIG. 2) in which it engages the fixed portion 34 to removably couple the voltage regulator module 20 into its connector (not shown) and into the microprocessor cage 12. The rotating portion 32 is also used to assist in removing the voltage regulator module 20 from its connector (not shown) and the microprocessor cage 12. Pivoting the rotating portion 32 causes it to engage the fixed portion 34 and apply an outward force, urging the voltage regulator module 20 to decouple from its connector (not shown) and slide out from microprocessor cage 12 along a track (not shown) formed in the side of the microprocessor cage 12. FIG. 3 illustrates the voltage regulator module 20 being removed from the microprocessor cage 12, and the rotating portions 32 pivoted to their decoupling position.

Figure 4A:
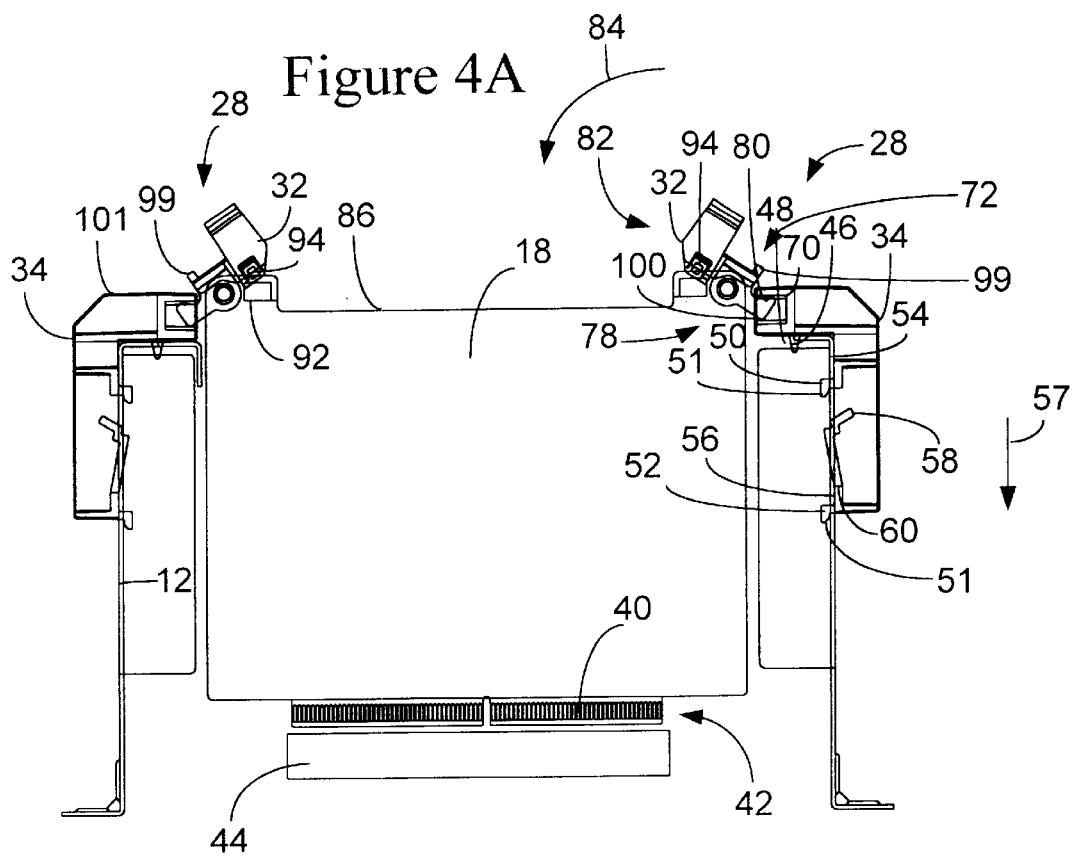
FIGS. 4A and 4B respectively illustrate top views of a printed circuit board released and held in place by the latching mechanism of FIG. 3.

Referring now to FIG. 4A, a partial cross sectional top view of the voltage regulator module 20 and microprocessor cage 12 is shown. The voltage regulator module 20 is shown with the metallic tabs 40 of its edge connector 42 spaced from a connector 44, in position to be inserted into or removed from the connector 42. The fixed portion 34 is coupled to the microprocessor cage 12 by a pair of pawls 50, 52 extending through openings 54, 56 in the side of the microprocessor cage 12. A cantilever 58 locks the fixed portion 34 against removal from the microprocessor cage 12. That is, during assembly, the fixed portion 34 is positioned on the side of the microprocessor cage 12 with its pawls 50, 52 extending through the openings 54, 56. The fixed portion 34 is then moved longitudinally in a direction indicated by an arrow 57 to engage enlarged portions 51 of the pawls 50, 52 with the back and edge of the openings 54, 56. As the fixed portion 34 is moved to its final longitudinal position, the cantilever 58, which by its construction is spring loaded in a direction toward the microprocessor cage 12, slides into an opening 60. With the cantilever 58 positioned in the opening 60, reverse longitudinal movement of the fixed portion 34 is prevented.

A frustoconically shaped alignment pin 46 located on the back of the fixed portion 34 extends through a similarly sized opening 48 in the microprocessor cage 12 when the fixed portion 34 is moved to its final longitudinal position. The alignment pin 46 assists in locating the fixed portion 34 at its proper location to engage the rotating portion 32 of the latching mechanism 28.

The fixed portion 34 has a bore 70 formed in an end portion 72 thereof. The bore 70 opens onto the end portion 72, removably receiving the rotating portion 32 therein. For example, the bore 70 may be defined in a portion of the cage, obviating the need for a separate fixed portion 34.

The rotating portion 32 has an opening 74 therein, through which the rotating portion 32 is coupled to the voltage regulator module 20 by, for example, a pin 76. The pin 76 can take on any of a variety of well-known configurations, such a screw, rivet, brad, split pin, or the like. A first end portion 78 of the rotating portion 34 has a first cam surface 80 formed thereon. A second end portion 82 of the rotating portion 34 is manually engageable to assist in inserting the voltage regulator module 20. The first end portion 78 is received in the bore 70 of the fixed portion 34 with the cam surface 80 engaging the interior wall of the bore 70. Urging the second end portion 82 in a direction indicated by an arrow 84 forces the cam surface 80 against the interior surface of the bore 70, moving the voltage regulator module 20 in the direction indicated by the arrow 57 and engaging the edge connector 42 with the connector 44.

Figure 4B:
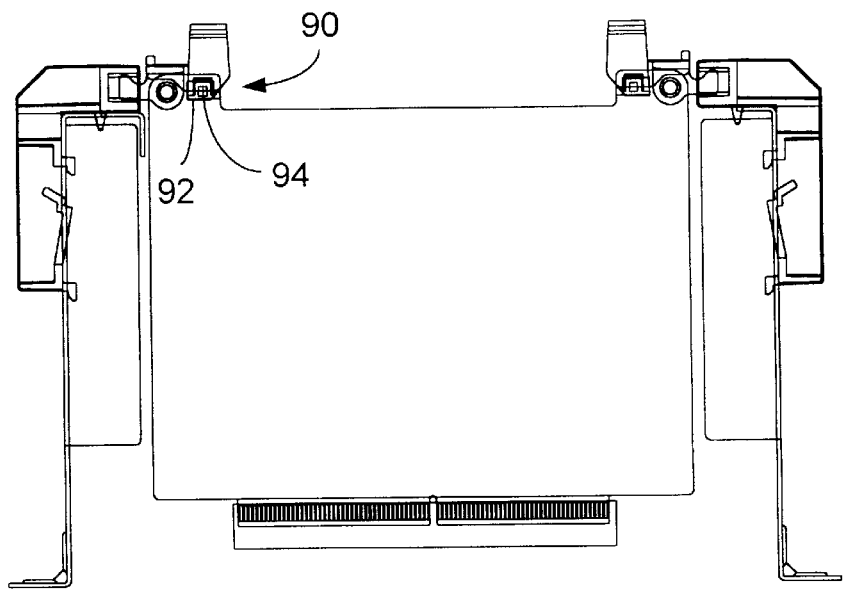

Once the voltage regulator module 20 is fully seated in the connector 44, it assumes the position illustrated in FIG. 4B.

In the position illustrated in FIG. 4B, a latch 90 is engaged to prevent reverse movement of the voltage regulator module 20, unless the latch 90 is disengaged. The latch 90 includes an opening 92 formed in the voltage regulator module 20 and an inclined and spring loaded surface 94 on the second end portion 82 of the rotating portion 32, as is more clearly illustrated in FIG. 5. As the second end portion rotates in the direction indicated by the arrow 84, the inclined surface 94 engages the voltage regulator module 20, causing the inclined surface 94 to be compressed until it aligns with the opening 92. When the inclined surface 94 aligns with the opening 92, the inclined surface decompresses, extending into the opening 92. With the inclined surface 94 positioned in the opening 92, an end surface 96 engages a sidewall of the opening 92, preventing reverse movement of the voltage regulator module 20 unless the inclined surface 94 is manually compressed. As is shown more clearly in the perspective view of FIG. 5, compression of the inclined surface 94 is accomplished in the illustrated embodiment by deforming a U-shaped cross section 95 of the second end portion 82. The inclined surface 94 is attached to one leg of the U-shaped cross section 95 such that when the legs of the U-shaped section 95 are urged toward one another, the inclined surface 94 is withdrawn from the opening 92.

Returning to FIG. 4A, the voltage regulator module 20 may also be inserted into the connector 44 by manually pushing on an end portion 86 of the voltage regulator module 20 in the direction indicated by the arrow 57. In this manner of use, the rotating portion 32 is positioned with the first end portion 78 directed toward the connector 44, overlying at least a portion of the voltage regulator module 20. As best seen in FIG. 5, to enhance the strength and durability of the first cam surface 80, the first end portion 78 is split in two substantially similar halves that overlay a portion of the front and back surfaces of the voltage regulator module 20. That is, the voltage regulator module 20 fits between the halves of the first end portion 78 when the first portion 32 is positioned in the insertion orientation.

The rotating portion 32 has a tab 99 formed on the first end portion 78. When the first portion 32 is in its insertion orientation, the tab 99 engages a top surface 101 of the fixed portion 34 during installation of the voltage regulator module 20. As the voltage regulator module 20 is urged into the microprocessor cage 12, the tab 99 is rotated about the pin 76 by contact with the top surface 101 of the fixed portion 34. Rotation of the rotating portion 32 causes its first end portion 78 to be inserted into the bore 70 of the fixed portion 34. The first end portion 78 of the rotating portion 32 has a second cam surface 100 that may engage an opposite interior surface of the bore 70, as compared to the interior surface engaged by the first cam surface 80. With the second cam surface 100 engaging the bore 70 of the fixed portion 34, the second end portion 82 of the rotating portion 32 is forced to move in the direction indicated by the arrow 84 until the edge connector 42 is seated in the connector 44 and the latch 90 is engaged.

The second cam surface 100 also serves a second function. That is, the second cam surface 100 is used to disengage the edge connector 42 from the connector 44. The inclined surface 94 is compressed to remove it from the opening 92. Next, the second end portion 82 is rotated in a direction opposite to that indicated by the arrow 84, engaging the second cam surface 100 with the bore 70 of the fixed portion 34. A force exerted by the cam surface 100 on the bore 70 urges the voltage regulator module 20 in a direction opposite to that indicated by the arrow 57, removing the edge connector 42 from the connector 44. The tab 99 also contacts the top surface 101 of the fixed portion 32 to provide additional removing force.

It is envisioned that the relative positions of the fixed and rotating portions 34, 32 may be reversed without departing from the spirit and scope of the instant invention. That is, the fixed portion 34, with appropriate modifications, may be coupled to the voltage regulator module 20, and the rotating portion 32, with appropriate modifications, may be coupled to the microprocessor cage 12.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus coupling a printed circuit board within a printed circuit board cage, comprising:

a first portion coupled to the printed circuit board cage, said first portion having a bore formed therein; and a second portion rotatably coupled to the printed circuit board, the second portion including:

a cam surface formed on a first end portion thereof, said cam surface being engageable with a first interior surface of said bore of said first portion to urge said second portion and said printed circuit board from a first position to a second position; and a latch formed on a second end portion thereof and being engageable with a mating surface on said printed circuit board in response to said second portion being located in said second position.

2. An apparatus, as set forth in claim 1, wherein the latch on said second portion includes an inclined surface adapted to engage with the mating surface located on said printed circuit board.

3. An apparatus, as set forth in claim 2, wherein the mating surface located on said printed circuit board includes an opening adapted to receive the inclined surface therein.

4. An apparatus, as set forth in claim 2, wherein the second end portion includes a member having a U-shaped cross sectional configuration and the inclined surface is coupled to a leg of said member.

5. An apparatus, as set forth in claim 1, wherein the second portion includes a second cam surface formed on the first end portion thereof, said second cam surface being engageable with a second interior surface of said bore of said first portion to urge said second portion and said printed circuit board from the second position to the first position.

6. An apparatus, as set forth in claim 1, wherein the second portion includes a tab formed on the first end portion thereof, said tab being engageable with one of the printed circuit board cage and the first portion to urge said second portion from a first position to a second position.

7. An apparatus, as set forth in claim 6, wherein the second position of said second portion includes the first end portion of said second portion being located within the bore of said first portion.

8. An apparatus, as set forth in claim 1, wherein the first portion includes at least one pawl engageable with an opening in said printed circuit board cage, said first portion being moveable between first and second positions with said pawl engaged in said opening, and a cantilever engageable with an opening in said printed circuit board in response to said first portion being moved to said second position, said cantilever restricting movement of said first portion in response to being engaged with said opening.

9. An apparatus, as set forth in claim 8, wherein said first portion includes a guide pin engageable with a corresponding opening in said printed circuit board cage in response to the first portion being in said second position.

10. An apparatus, as set forth in claim 9, wherein said guide pin is frustoconical.

11. An apparatus coupling a printed circuit board within a printed circuit board cage, comprising:
   a first portion coupled to the printed circuit board, said first portion having a bore formed therein; and
   a second portion rotatably coupled to the printed circuit board cage, the second portion including:
      a cam surface formed on a first end portion thereof, said cam surface being engageable with a first interior surface of said bore of said first portion to urge said first portion and said printed circuit board from a first position to a second position; and
      a latch formed on a second end portion thereof and being engageable with a corresponding latch on said printed circuit board cage in response to said first portion being located in said second position.

12. An apparatus, as set forth in claim 11, wherein the latch on said second portion includes an inclined surface adapted to engage with a mating surface located on said printed circuit board cage.

13. An apparatus, as set forth in claim 12, wherein the mating surface located on said printed circuit board cage includes an opening adapted to receive the inclined surface therein.

14. An apparatus, as set forth in claim 12, wherein the second end portion includes a member having a U-shaped cross sectional configuration and the inclined surface is coupled to a leg of said member.

15. An apparatus, as set forth in claim 11, wherein the second portion includes a second cam surface formed on the first end portion thereof, said second cam surface being engageable with a second interior surface of said bore of said first portion to urge said first portion and said printed circuit board from the second position to the first position.

16. An apparatus, as set forth in claim 11, wherein the second portion includes a tab formed on the first end portion thereof, said tab being engageable with one of the printed circuit board and the first portion to urge said second portion from a first position to a second position.

17. An apparatus, as set forth in claim 16, wherein the second position of said second portion includes the first end portion of said second portion being located within the bore of said first portion.

18. An apparatus coupling a printed circuit board within a printed circuit board cage, comprising:
   a first portion coupled to the printed circuit board cage, said first portion having a bore formed therein; and
   a second portion rotatably coupled to the printed circuit board, the second portion including:
      a cam surface formed on a first end portion thereof, said cam surface being engageable with an interior surface of said bore of said first portion to urge said second portion and said printed circuit board from a first position to a second position; and
      a latch formed on a second end portion thereof and being engageable with a mating surface on said printed circuit board in response to said second portion being located in said second position, the latch on said second portion including an inclined surface coupled to a leg of a resilient member having a U-shaped cross sectional configuration.

19. An apparatus, as set forth in claim 18, wherein the mating surface located on said printed circuit board includes an opening adapted to receive the inclined surface therein.

20. An apparatus, as set forth in claim 18, wherein the second portion includes a second cam surface formed on the first end portion thereof, said second cam surface being engageable with an interior surface of said bore of said first portion to urge said second portion and said printed circuit board from the second position to the first position.

21. An apparatus, as set forth in claim 18, wherein the second portion includes a tab formed on the first end portion thereof, said tab being engageable with one of the printed circuit board cage and the first portion to urge said second portion from a first position to a second position.

22. An apparatus, as set forth in claim 21, wherein the second position of said second portion includes the first end portion of said second portion being located within the bore of said first portion.

23. An apparatus, as set forth in claim 18, wherein the first portion includes at least one pawl engageable with an opening in said printed circuit board cage, said first portion being moveable between first and second positions with said pawl engaged in said opening, and a cantilever engageable with an opening in said printed circuit board in response to said first portion being moved to said second position, said cantilever restricting movement of said first portion in response to being engaged with said opening.

24. An apparatus, as set forth in claim 23, wherein said first portion includes a guide pin engageable with a corresponding opening in said printed circuit board cage in response to the first portion being in said second position.

25. An apparatus, as set forth in claim 24, wherein said guide pin is frustoconical.

26. An apparatus coupling a printed circuit board within a printed circuit board cage, comprising:
   a first portion coupled to the printed circuit board cage, said first portion having a bore formed therein; and
   a second portion coupled to the printed circuit board, the second portion including:
      means for engaging with a first interior surface of said bore of said first portion to urge said second portion and said printed circuit board from a first position to a second position; and
      means for engaging with a mating surface on said printed circuit board in response to said second portion being located in said second position.

* * * * *